United States Patent
Liu et al.

(10) Patent No.: US 11,060,182 B2
(45) Date of Patent: Jul. 13, 2021

(54) METHOD OF FORMING METAL LAYER, SEMICONDUCTOR DEVICE AND METHOD OF FABRICATING SAME

(71) Applicant: Shanghai Huahong Grace Semiconductor Manufacturing Corporation, Shanghai (CN)

(72) Inventors: Chong Liu, Shanghai (CN); Jike Wu, Shanghai (CN); Xiuliang Cao, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 27 days.

(21) Appl. No.: 16/657,152

(22) Filed: Oct. 18, 2019

(65) Prior Publication Data
US 2020/0232089 A1    Jul. 23, 2020

(30) Foreign Application Priority Data
Jan. 22, 2019  (CN) .......................... 201910058766.8

(51) Int. Cl.
  *C23C 14/35*  (2006.01)
  *H01L 21/02*  (2006.01)
  *C23C 14/18*  (2006.01)

(52) U.S. Cl.
  CPC ............ *C23C 14/35* (2013.01); *C23C 14/185* (2013.01); *H01L 21/02631* (2013.01)

(58) Field of Classification Search
CPC .. H01L 21/02631; C23C 14/35; C23C 14/185
See application file for complete search history.

(56) References Cited

U.S. PATENT DOCUMENTS

| | | | | |
|---|---|---|---|---|
| 5,443,995 A * | 8/1995 | Nulman | ............ | H01L 21/76838 204/192.17 |
| 5,633,199 A * | 5/1997 | Fiordalice | ......... | H01L 21/76877 257/E21.585 |
| 5,851,920 A * | 12/1998 | Taylor | ............... | H01L 21/76838 438/648 |
| 6,969,448 B1 * | 11/2005 | Lau | ........................ | C23C 14/046 204/192.17 |
| 2014/0070832 A1 * | 3/2014 | Fay | ...................... | H05K 999/99 324/754.11 |

\* cited by examiner

*Primary Examiner* — Christine A Enad
(74) *Attorney, Agent, or Firm* — Murtha Cullina LLP

(57) ABSTRACT

A semiconductor device and a method of fabricating the device are disclosed. The method of forming a metal layer includes: placing a substrate in a sputtering chamber; forming a first metal sub-layer on the substrate by performing a magnetron sputtering process; and forming a second metal sub-layer on the first metal sub-layer by performing another magnetron sputtering process and concurrently introducing a heated gas stream in the sputtering chamber, wherein the first metal sub-layer and the second metal sub-layer together constitute the metal layer and are each formed of aluminum doped with copper. The metal layer resulting from this method contains uniformly-sized small crystal grains separated from one another by minimal gaps between their grain boundaries. This imparts to the metal layer high surface flatness with fewer undesired bumps and hence good appearance, resulting in an increase in its yield.

5 Claims, 3 Drawing Sheets

METHOD OF FORMING METAL LAYER, SEMICONDUCTOR DEVICE AND METHOD OF FABRICATING SAME

CROSS-REFERENCE TO RELATED APPLICATION

This application claims the priority of Chinese patent application number 201910058766.8, filed on Jan. 22, 2019, the entire contents of which are incorporated herein by reference.

TECHNICAL FIELD

The present invention relates to the fabrication of semiconductor integrated circuits (ICs) and, in particular, to a method of forming a metal layer, a semiconductor device and a method of fabricating the device.

BACKGROUND

Magnetron sputtering is a physical vapor deposition (PVD) technique widely used in the fabrication of semiconductor devices, in which a magnetic field is applied to the surface of a cathode target in order to confine charged plasma particles, thereby increasing the plasma density and hence the sputtering rate. More specifically, electrons flying toward a substrate under the effect of an electric field E collide with argon (Ar) atoms, transforming them into positive Ar ions and new free electrons. The new electrons then fly toward the substrate, while the Ar ions are accelerated by the electric field to fly toward the cathode target and bomb the target surface with high energy, causing sputtering of the target material.

Currently, the magnetron sputtering process as defined above is usually utilized to deposit a metal layer over a semiconductor device and, in order to speed up the formation of the metal layer, is usually performed in a high-temperature environment (i.e., as a thermal magnetron sputtering process). However, on the surface of the metal layer formed by this thermal magnetron sputtering process, undesired bumps are often seen, and when a portion of the metal layer with one or more such bumps is etched away to form a trench, the bottom of the resulting trench may also undesirably bulge, impairing the appearance thereof. In worst cases, such appearance impairments may lead to scrappage of the semiconductor device being fabricated, thus lowering its yield.

SUMMARY OF THE INVENTION

It is an objective of the present invention to provide a method of forming a metal layer with fewer undesired bumps.

It is another objective of the present invention to provide a semiconductor device with fewer undesired bumps and hence improved appearance and a method of fabricating such a semiconductor device with higher yield.

To this end, in one aspect of the present invention, there is provided a method of forming a metal layer, including the steps of: placing a substrate in a sputtering chamber; forming a first metal sub-layer on the substrate by performing a magnetron sputtering process; and forming a second metal sub-layer on the first metal sub-layer by performing another magnetron sputtering process and concurrently introducing a heated gas stream in the sputtering chamber, wherein the first metal sub-layer and the second metal sub-layer together constitute the metal layer, wherein each of the first and second metal sub-layers is formed of aluminum doped with copper.

Optionally, the heated gas stream introduced in the sputtering chamber during the formation of the second metal sub-layer may have a temperature of from 250° C. to 450° C.

Further, the method may further include introducing, during the formation of the first metal sub-layer, a heated gas stream with a temperature lower than 250° C. into the sputtering chamber.

Optionally, no heated gas stream may be introduced into the sputtering chamber during the formation of the first metal sub-layer.

Further, a thickness ratio of the first metal sub-layer to the second metal sub-layer may range from 1:9 to 6:4.

Further, the first and second metal sub-layers may have a total thickness that is greater than or equal to 2 μm.

Optionally, in each of the first and second metal sub-layers, a mass ratio of copper to aluminum may be smaller than or equal to 2:98.

In another aspect of the present invention, there is provided a method of fabricating a semiconductor device, including the steps of: placing a substrate with an oxide layer formed thereon in a sputtering chamber; forming a first metal sub-layer on the oxide layer by performing a magnetron sputtering process; forming a second metal sub-layer on the first metal sub-layer by performing another magnetron sputtering process and concurrently introducing a heated gas stream in the sputtering chamber, wherein the first and second metal sub-layers together constitute a metal layer and are each formed of aluminum doped with copper; and forming a passivation layer on the second metal sub-layer and forming a trench which penetrates through the passivation layer, the second metal sub-layer and the first metal sub-layer and terminates at the oxide layer.

Optionally, the heated gas stream introduced in the sputtering chamber during the formation of the second metal sub-layer may have a temperature of from 250° C. to 450° C.

Further, the method may further include introducing, during the formation of the first metal sub-layer, a heated gas stream with a temperature lower than 250° C. into the sputtering chamber.

Optionally, no heated gas stream may be introduced into the sputtering chamber during the formation of the first metal sub-layer.

In still another aspect of the present invention, there is provided semiconductor device fabricated by the method as defined above.

Compared to the prior art, the present invention offers the following benefits:

It provides a method of forming a metal layer, a semiconductor device and a method of fabricating the device. In the first method, a first metal sub-layer is formed on a substrate by performing a magnetron sputtering process at a low temperature and a second metal sub-layer is then formed by performing another magnetron sputtering process at a high temperature. The so-obtained metal layer contains uniformly-sized small crystal grains separated from one another by minimal gaps between their grain boundaries. Therefore, when the metal layer is etched to form a through or blind trench therein during the fabrication of a semiconductor device in which the metal layer is formed, the number of undesired bumps will be reduced, and the appearance of the semiconductor device being fabricated can be improved, resulting in an increase in its yield.

BRIEF DESCRIPTION OF THE DRAWINGS

In FIG. 1: a—undesired bump; 10—substrate; 20—metal layer; 30—passivation layer; 40—trench.

In FIG. 3: 100—substrate; 200—oxide layer; 310—first transition metal layer; 320—second transition metal layer; 400—metal layer; 410—first metal sub-layer; 420—second metal sub-layer; 500—passivation layer; 600—trench.

DETAILED DESCRIPTION OF THE INVENTION

Figure 1:
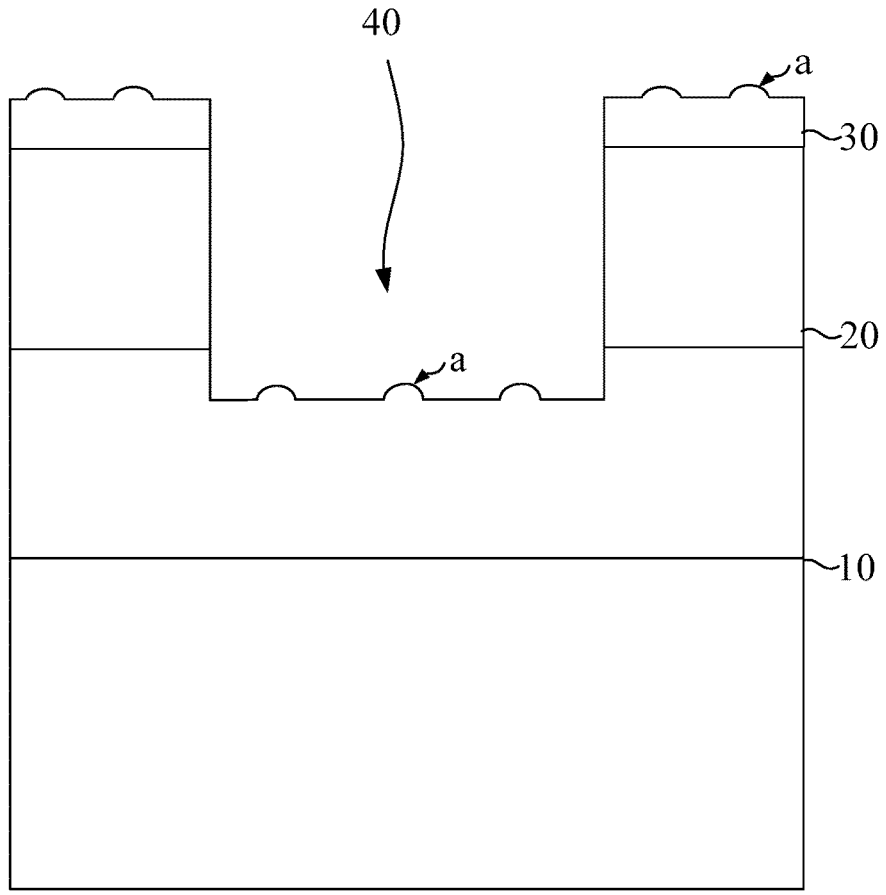
FIG. 1 is a structural schematic of a conventional semiconductor device with undesired bumps.

FIG. 1 is a structural schematic of a conventional semiconductor device with undesired bumps a. As shown, in the semiconductor device, a metal layer 20 (e.g., an aluminum (Al) layer doped with copper (Cu)) is formed on a substrate 10 by a thermal magnetron sputtering process performed at a temperature in the range of 250° C.–450° C. The present inventors have found that, during the sputtering of the Al layer on the substrate 10, large Al crystal grains grow due to the high temperature environment and are distributed irregularly throughout the Al layer. With such irregular crystal grains continually emerging and growing, the surface flatness of the Al layer, which is intrinsically low, in particular, at a large thickness (e.g., greater than or equal to 2 μm) of the Al layer is deteriorated, making the resulting Al layer unsuitable to be planarized. Moreover, since the large crystal grains grown in the high temperature environment are separated from one another by large gaps between their grain boundaries (i.e., gap between adjacent crystal lattices), and due to the fact that a passivation layer 30 on the Al layer is formed with a uniform thickness throughout the passivation layer, portions of the passivation layer over the gaps between the grain boundaries are lower than the rest, exaggerating the surface roughness of the Al layer into undesired bumps a, resulting in the appearance deterioration of the semiconductor device being fabricated. Additionally, since Cu doped in the Al layer tends to aggregate between the grain boundaries, and because of a higher etching selectivity ratio of Cu than of Al to the substrate 10, during the formation of a trench 40 in the Al layer by etching away a portion thereof, the etching between the grain boundaries, where Cu aggregates, proceeds obviously slower than the etching at the crystal grains, leaving undesired bumps a of various heights at portions of the bottom of the trench 40 corresponding to the layer portions between the grain boundaries. Some of these undesired bumps may be as large as can be viewed by the naked eye, thus impairing the appearance, and even possibly leading to scrappage and hence a reduction in yield of, the semiconductor device being fabricated.

Based on the above findings, the present invention provides a method of forming a metal layer, a semiconductor device and a method of fabricating the device. According to the invention, the metal layer may be formed by depositing a first metal sub-layer on a substrate by magnetron sputtering at a low temperature and then depositing a second metal sub-layer thereon by magnetron sputtering at a high temperature. The so-obtained metal layer contains uniformly-sized small crystal grains separated from one another by minimal gaps between their grain boundaries and thus has high surface flatness. Therefore, when the metal layer is etched to form a through or blind trench therein during the fabrication of a semiconductor device in which the metal layer is formed, the number of undesired bumps will be reduced, and the appearance of the semiconductor device being fabricated can be improved, resulting in an increase in its yield.

The methods and semiconductor device of the present invention will be described in greater detail below with reference to the accompanying flowcharts and schematic diagrams, which present preferred embodiments of the invention. It is to be appreciated that those skilled in the art can make changes to the invention disclosed herein while still obtaining the beneficial results thereof. Therefore, the following description shall be construed as being intended to be widely known by those skilled in the art rather than as limiting the invention.

The present invention will be further described in the following paragraphs by way of examples with reference to the accompanying drawings. Features and advantages of the invention will be more apparent from the following detailed description. Note that the accompanying drawings are provided in a very simplified form not necessarily presented to scale, and their only intention is to facilitate convenience and clarity in explaining the disclosed embodiments.

Figure 2:
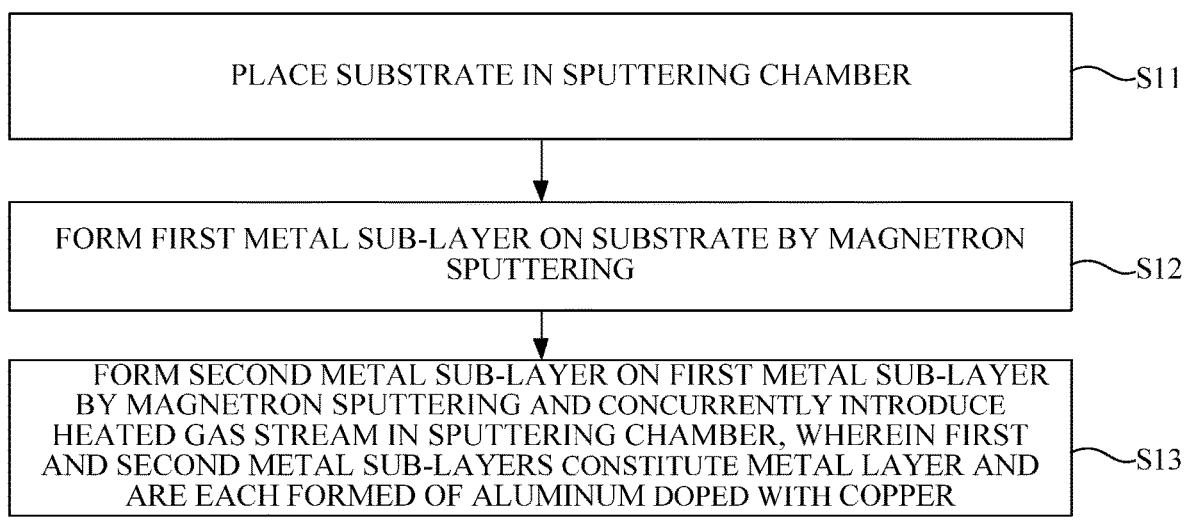
FIG. 2 is a schematic flowchart of a method for forming a metal layer according to an embodiment of the present invention.

FIG. 2 is a schematic flowchart of a method for forming a metal layer according to an embodiment of the present invention. As illustrated, the method includes the steps of: S11) placing a substrate in a sputtering chamber; S12) forming a first metal sub-layer on the substrate by performing a magnetron sputtering process; and S13) forming a second metal sub-layer on the first metal sub-layer by performing another magnetron sputtering process and concurrently introducing a heated gas stream in the sputtering chamber, wherein the first metal sub-layer and the second metal sub-layer together constitute the metal layer and are each formed of Al doped with Cu.

Figure 3:
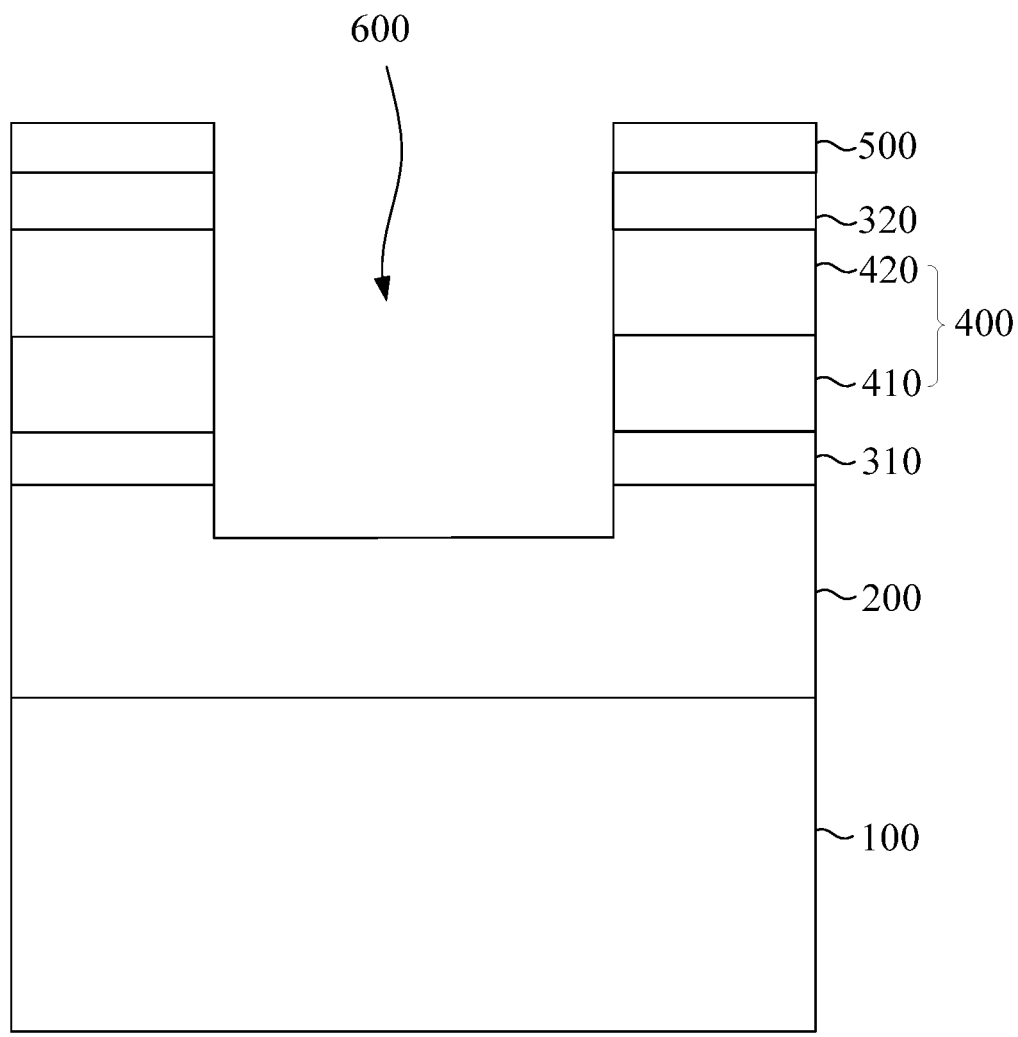
FIG. 3 is a structural schematic of a semiconductor device according to an embodiment of the present invention.

FIG. 3 is a structural schematic of a semiconductor device containing a metal layer made in accordance with an embodiment of the present invention. As shown, step S11 is first performed, in which a substrate 100 is placed in a sputtering chamber. The substrate 100 may be, for example, a silicon substrate.

Step S12 is then preformed, in which a magnetron sputtering process is carried out to form a first metal sub-layer 410 on the substrate 100. The first metal sub-layer is formed of Al doped with Cu, with a mass ratio of Cu to Al that is smaller than or equal to 2:98. During the formation of the first metal sub-layer, a heated gas stream with a temperature lower than 250° C. such as, for example, 1° C., 10° C., 30° C., 50° C., 100° C., 150° C., 200° C., 225° C., etc. may be introduced into the sputtering chamber. Alternatively, during the formation of the first metal sub-layer, no heated gas may be introduced into the sputtering chamber. In a preferred embodiment, during the formation of the first metal sub-layer, no heated gas stream is introduced into the sputtering chamber. For this reason, the process for forming the first metal sub-layer 410 can be also called "cold sputtering". The first metal sub-layer 410 resulting from such a cold sputtering process contains uniformly-sized small crystal grains separated from one another by minimal gaps between their grain boundaries and thus has high surface flatness. Since the cold sputtering process is performed at a relatively low temperature, if it were continued to be used to form the subsequent second metal sub-layer 420, other defects would be expected on the surface of the second metal sub-layer 420, such as rod-like Al bumps.

In order to avoid this, step S13 is then performed, in which a second metal sub-layer 420 is formed on the first metal sub-layer 410 by another magnetron sputtering process performed and concurrently introducing a heated gas stream in the sputtering chamber. The first metal sub-layer 410 and the second metal sub-layer 420 together constitute the metal layer 400. The second metal sub-layer is also formed of Al doped with Cu, with a mass ratio of Cu to Al that is smaller than or equal to 2:98. In general, the Cu/Al mass ratio of the first metal sub-layer is equal to the Cu/Al mass ratio of the second metal sub-layer. Of course, the Cu/Al mass ratio of the first metal sub-layer may also differ from the Cu/Al mass ratio of the second metal sub-layer. The heated gas stream introduced into the sputtering chamber during the formation of the second metal sub-layer 420 may have a temperature in the range of 250° C.-450° C., such as 250° C., 270° C., 300° C., 320° C., 340° C., 420° C., 450° C., etc. Therefore, the process for forming the second metal sub-layer 420 may also be called "hot sputtering". That is, the second metal sub-layer 420 is formed at a temperature higher than a temperature at which the first metal sub-layer 410 is formed. In the hot sputtering process, the second metal sub-layer 420 grows across the first metal sub-layer 410 that contains uniformly-sized small crystal grains separated from one another by minimal gaps between their grain boundaries. Therefore, it also contains uniformly-sized small crystal grains separated from one another by minimal gaps between their grain boundaries and thus has high surface flatness. Compared to conventional ones obtained by single thermal magnetron sputtering processes, the metal layer 400 consisting of the first and second metal sub-layers 410, 420 resulting from the separate magnetron sputtering processes performed at different temperatures, according to this embodiment, contains crystal grains that are significantly reduced in size and separated from one another by much narrower gaps between their grain boundaries and therefore has higher surface flatness with fewer undesired bumps. Therefore, appearance deterioration caused by such bumps can be mitigated, resulting in enhanced yield. A thickness ratio of the first metal sub-layer 410 to the second metal sub-layer 420 may range from 1:9 to 6:4. According to this embodiment, the first and second metal sub-layers 410, 420 may have a total thickness that is at least greater than or equal to 2 μm. In other embodiments, the total thickness of them may also be smaller than 2 μm.

Figure 4:
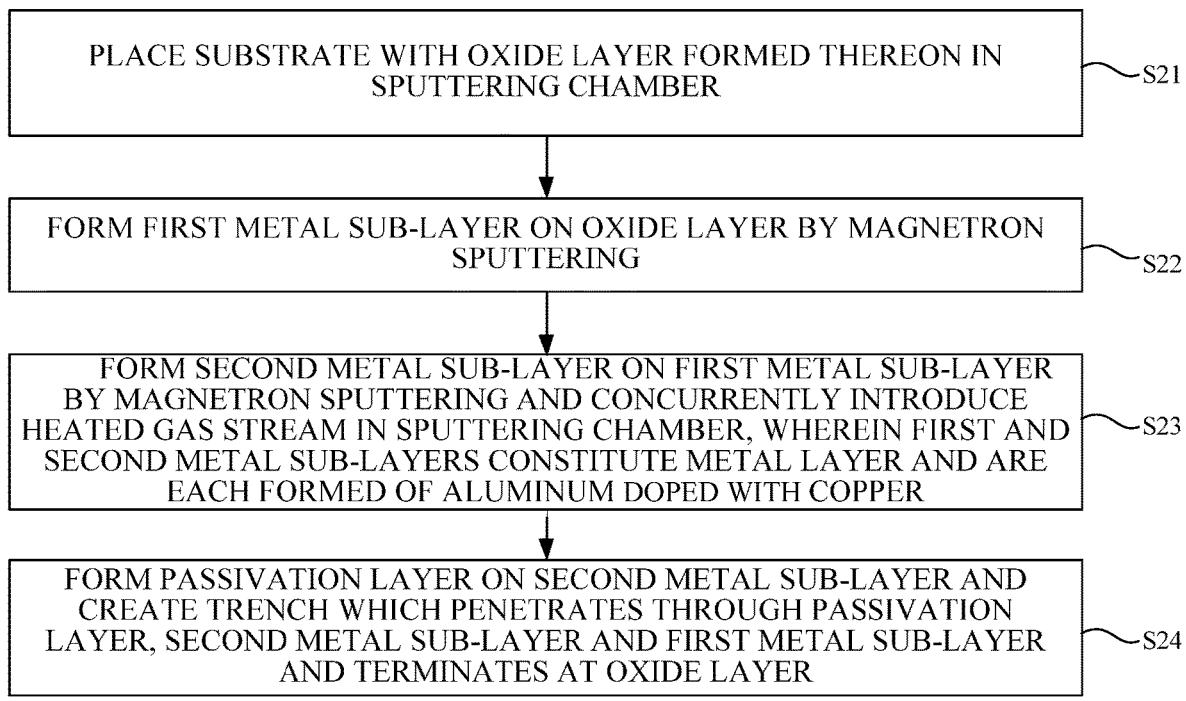
FIG. 4 is a schematic flowchart of a method for fabricating a semiconductor device according to an embodiment of the present invention.

FIG. 4 is a flowchart of a method of fabricating a semiconductor device according to an embodiment of the present invention. As shown, the method includes the steps of: S21) placing a substrate with an oxide layer formed thereon in a sputtering chamber; S22) forming a first metal sub-layer on the oxide layer by performing a magnetron sputtering process; S23) forming a second metal sub-layer on the first metal sub-layer by performing another magnetron sputtering process and concurrently introducing a heated gas stream in the sputtering chamber, wherein the first and second metal sub-layers constitute a metal layer and are each formed of Al doped with Cu; and S24) forming a passivation layer on the second metal sub-layer and forming a trench which penetrates through the passivation layer, the second metal sub-layer and the first metal sub-layer and terminates at the oxide layer.

With continued reference to FIG. 3, step S21 is first performed, in which a substrate 100 with an oxide layer 200 formed thereon is placed in a sputtering chamber. The substrate 100 may be, for example, a silicon substrate.

Due to poor adhesion of the oxide layer 200 to the subsequent first metal sub-layer 410, a first transition metal layer 310 may be then formed on the oxide layer 200. The first transition metal layer 310 may be, for example, a titanium or titanium nitride layer.

Step S22 is then performed, in which a first metal sub-layer 410 is formed on the oxide layer 200 by magnetron sputtering. The first metal sub-layer is made of Al doped with Cu, with a Cu/Al mass ratio of smaller than or equal to 2:98. During the formation of the first metal sub-layer, a heated gas stream with a temperature, for example, lower than 250° C. such as 1° C., 10° C., 30° C., 50° C., 100° C., 150° C., 200° C., 225° C., etc. may be introduced into the sputtering chamber. Alternatively, during the formation of the first metal sub-layer, no heated gas may be introduced into the sputtering chamber. In a preferred embodiment, during the formation of the first metal sub-layer, no heated gas stream is introduced into the sputtering chamber. For this reason, the process for forming the first metal sub-layer 410 can be also called "cold sputtering". The first metal sub-layer 410 resulting from such a cold sputtering process contains uniformly-sized small crystal grains separated from one another by minimal gaps between their grain boundaries and thus has high surface flatness.

Step S23 is then performed, in which a second metal sub-layer 420 is formed on the first metal sub-layer 410 by performing another magnetron sputtering process and concurrently introducing a heated gas stream in the sputtering chamber. The heated gas stream may have a temperature in the range of 250° C.-450° C., and the first and second metal sub-layer 410, 420 constitute a metal layer 400. The second metal sub-layer is also formed of Al doped with Cu, with a Cu/Al mass ratio of smaller than or equal to 2:98.

Step S24 is then performed, in which a passivation layer 500 is formed on the second metal sub-layer 420 and then a trench 600 is formed, the trench 600 penetrates through the passivation layer 500, the second metal sub-layer 420, the first metal sub-layer 410 and a portion of the oxide layer 200. The passivation layer 500 may be, for example, silicon oxynitride. Since the first and second metal sub-layer 410, 420 formed in steps 22, 23, respectively, have few or even no undesired bumps on their surfaces, the passivation layer 500 and the trench 600 also have few or even no undesired bumps on their surfaces, avoiding appearance deterioration possibly caused by such bumps as well as scrappage of the semiconductor device being fabricated when such appearance deterioration is very serious. As a result, an increase in yield of the semiconductor device can be achieved.

Due to weak adhesion of the second metal sub-layer 420, the method may further include, subsequent to the formation of the second metal sub-layer 420 and prior to the formation of the passivation layer 500, forming a second transition metal layer 320 on the second metal sub-layer 420. The second transition metal layer 320 may be, for example a titanium or titanium nitride layer.

It is to be noted that, while it has been described above in this embodiment that the oxide and passivation layers are formed over the substrate, they are merely exemplary. Indeed, other layers, such as a nitride layer, may also be formed over the substrate, and the positions of the layers may vary.

With continued reference to FIG. 3, the present invention also provides a semiconductor device fabricated by the method as defined above. Specifically, the semiconductor device may include a substrate 100, and stacked sequentially over the substrate 100, an oxide layer 200, a first metal sub-layer 410, a second metal sub-layer 420 and a passivation layer 500. A thickness ratio of the first metal sub-layer 410 to the second metal sub-layer 420 may range from 1:9 to 6:4. Additionally, a first transition metal layer 310 may be disposed between the oxide layer 200 and the first metal sub-layer 410, and a second transition metal layer 320 may be disposed between the second metal sub-layer 420 and the passivation layer 500. A trench 600 may be formed in the semiconductor device, which penetrates through the passivation layer 500, the second metal sub-layer 420, the first metal sub-layer 410 and a portion of the oxide layer 200. As detailed above, since the first metal sub-layer 410 contains uniformly-sized small crystal grains separated from one another by minimal gaps between their grain boundaries and thus has high surface flatness, the second metal sub-layer 420 grown across the first metal sub-layer 410 also contains uniformly-sized small crystal grains separated from one another by minimal gaps between their grain boundaries and thus has high surface flatness. As a result, there are fewer undesired bumps on the surfaces of the passivation layer and the trench, and the semiconductor device has improved appearance.

In summary, the present invention provides a method of forming a metal layer, a semiconductor device and a method of fabricating the device. In the first method, a first metal sub-layer is formed on a substrate by performing a magnetron sputtering process at a low temperature and a second metal sub-layer is then formed by performing another magnetron sputtering process at a high temperature. The so-obtained metal layer contains uniformly-sized small crystal grains separated from one another by minimal gaps between their grain boundaries. Therefore, when the metal layer is etched to form a through or blind trench therein during the fabrication of a semiconductor device in which the metal layer is formed, the number of undesired bumps will be reduced, and the appearance of the semiconductor device being fabricated can be improved, resulting in an increase in its yield.

It is to be noted that, as used herein, the terms "first", "second" and the like are only meant to distinguish various components, elements, steps, etc. from each other rather than necessarily indicate logical or sequential orderings thereof, unless otherwise indicated or specified.

It will be appreciated that, while the invention has been described with reference to several preferred embodiments, it is not intended to be limited to these embodiments in any way. In light of the teachings hereinabove, any person of skill in the art may make various possible variations and changes to the disclosed embodiments or modify them into equivalent alternatives, without departing from the scope of the invention. Accordingly, any and all such simple variations, equivalent alternatives and modifications made to the foregoing embodiments without departing from the scope of the invention are intended to fall within the scope thereof

What is claimed is:

1. A method of fabricating a semiconductor device, comprising the steps of:
    placing a substrate with an oxide layer formed thereon in a sputtering chamber;
    forming a first metal sub-layer on the oxide layer by performing a magnetron sputtering process;
    forming a second metal sub-layer on the first metal sub-layer by performing another magnetron sputtering process and concurrently introducing a heated gas stream in the sputtering chamber, wherein the first and second metal sub-layers together constitute a metal layer and are each formed of aluminum doped with copper; and
    forming a passivation layer on the second metal sub-layer and forming a trench which penetrates through the passivation layer, the second metal sub-layer and the first metal sub-layer and terminates at the oxide layer.

2. The method of claim 1, wherein the heated gas stream introduced in the sputtering chamber during the formation of the second metal sub-layer has a temperature of from 250° C. to 450° C.

3. The method of claim 2, further comprising introducing, during the formation of the first metal sub-layer, a heated gas stream with a temperature lower than 250° C. into the sputtering chamber.

4. The method of claim 2, wherein no heated gas stream is introduced into the sputtering chamber during the formation of the first metal sub-layer.

5. A semiconductor device, which is fabricated by the method of claim 1.

* * * * *